US008945722B2

(12) United States Patent  
Thompson et al.

(10) Patent No.: US 8,945,722 B2  
(45) Date of Patent: Feb. 3, 2015

(54) MATERIALS AND ARCHITECTURES FOR EFFICIENT HARVESTING OF SINGLET AND TRIPLET EXCITONS FOR WHITE LIGHT EMITTING OLEDS

(75) Inventors: Mark E. Thompson, Anaheim, CA (US); Stephen Forrest, Ann Arbor, MI (US)

(73) Assignees: The University of Southern California, Los Angeles, CA (US); The Regents of the University of Michigan, Ann Arbor, MI (US)

( * ) Notice: Subject to any disclaimer, the term of this patent is extended or adjusted under 35 U.S.C. 154(b) by 512 days.

(21) Appl. No.: 11/588,619

(22) Filed: Oct. 27, 2006

(65) Prior Publication Data

US 2008/0102310 A1 May 1, 2008

(51) Int. Cl.
 *H01L 51/50* (2006.01)
 *C09K 11/06* (2006.01)
 *B32B 9/04* (2006.01)

(52) U.S. Cl.
 CPC ......... *H01L 51/5036* (2013.01); *H01L 51/5016* (2013.01); *Y10S 428/917* (2013.01)
 USPC ........... 428/690; 428/917; 313/504; 313/506; 313/509; 257/40

(58) Field of Classification Search
 None
 See application file for complete search history.

(56) References Cited

U.S. PATENT DOCUMENTS

| | | | |
|---|---|---|---|
| 4,769,292 A | 9/1988 | Tang et al. | |
| 5,121,029 A | 6/1992 | Hosokawa et al. | |
| 5,130,603 A | 7/1992 | Tokailen et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,908,581 A | 6/1999 | Chen et al. | |
| 5,935,720 A | 8/1999 | Chen et al. | |
| 5,989,737 A | 11/1999 | Xie et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,242,115 B1* | 6/2001 | Thomson et al. | 428/690 |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,361,886 B2* | 3/2002 | Shi et al. | 428/690 |
| 6,468,819 B1 | 10/2002 | Kim et al. | |
| 6,548,956 B2 | 4/2003 | Forrest et al. | |
| 6,576,134 B1 | 6/2003 | Agner | |
| 6,602,540 B2 | 8/2003 | Gu et al. | |
| 6,830,828 B2 | 12/2004 | Thompson et al. | |
| 6,835,469 B2 | 12/2004 | Kwong et al. | |
| 6,863,997 B2 | 3/2005 | Thompson et al. | |
| 6,869,695 B2 | 3/2005 | Thompson et al. | |
| 7,071,615 B2 | 7/2006 | Lu et al. | |
| 7,579,773 B2* | 8/2009 | Forrest et al. | 313/504 |
| 2002/0034656 A1 | 3/2002 | Thompson et al. | |
| 2002/0127427 A1* | 9/2002 | Young et al. | 428/690 |
| 2002/0182441 A1 | 12/2002 | Lamansky et al. | |
| 2002/0197511 A1* | 12/2002 | D'Andrade et al. | 428/690 |
| 2003/0072964 A1 | 4/2003 | Kwong et al. | |
| 2003/0230980 A1 | 12/2003 | Forrest et al. | |
| 2004/0185300 A1 | 9/2004 | Hatwar et al. | |
| 2005/0074630 A1 | 4/2005 | Kanno et al. | |
| 2005/0164033 A1 | 7/2005 | Chin et al. | |
| 2006/0214568 A1 | 9/2006 | Yamazaki et al. | |
| 2006/0232194 A1* | 10/2006 | Tung et al. | 313/504 |
| 2006/0273714 A1* | 12/2006 | Forrest et al. | 313/504 |

FOREIGN PATENT DOCUMENTS

| | | |
|---|---|---|
| EP | 1 670 083 | 6/2006 |
| EP | 1 701 394 | 9/2006 |
| EP | 1 961 741 | 8/2008 |
| EP | 2 166 588 | 3/2010 |
| JP | H05-263073 | 10/1993 |
| JP | 2004-526284 | 8/2004 |
| JP | 2004-311420 | 11/2004 |
| JP | 2005-019413 | 1/2005 |
| JP | 2006-172762 | 6/2006 |
| WO | 02/074015 | 9/2002 |
| WO | WO 02/074015 | 9/2002 |
| WO | 2004/060026 | 7/2004 |
| WO | 2006/013738 | 2/2006 |
| WO | 2006/015862 | 2/2006 |
| WO | 2006/076092 | 7/2006 |
| WO | WO 2006/130883 | 12/2006 |

(Continued)

OTHER PUBLICATIONS

Schwartz et al. "Highly efficient white orgnic light emitting diodes comprising an interlayer to separate fluorescent and phosphorescent regions" Applied Physics Letters, 2006, 89, 083509. Published online Aug. 22, 2006.*

(Continued)

*Primary Examiner* — Andrew K Bohaty

(74) *Attorney, Agent, or Firm* — Morgan, Lewis & Bockius, LLP

(57) ABSTRACT

The present invention relates to organic light emitting devices (OLEDs), and more specifically to OLEDS that emit light using a combination of fluorescent emitters and phosphorescent emitters for the efficient utilization of all of the electrically generated excitons.

13 Claims, 7 Drawing Sheets

(56) References Cited

FOREIGN PATENT DOCUMENTS

| WO | 2007/069607 | 6/2007 |
| WO | WO 2007/145719 | 12/2007 |
| WO | 2009/008344 | 1/2009 |

OTHER PUBLICATIONS

Koene et al. "Asymmetric Triaryldiamines as Thermally Stable Hole Transporting Layers for Organic Light-Emitting Devices" Chem. Mater., 1998, 10, 2235-2250. Published Jul. 21, 1998.*

Cheng et al. Applied Physics Letters 2003, 82, 4224-4226. Date of publication: Jun. 16, 2003.*

U.S. Appl. No. 10/233,470, filed Sep. 4, 2002, Shtein et al.

U.S. Appl. No. 11/097,352, filed Apr. 4, 2005, Kwong.

Adachi et al., "Nearly 100% Internal Phosphorescent Efficiency in an Organic Light Emitting Device, " J. Appl. Phys. 90:5048, 2001.

Baldo et al., "Highly Efficient Phosphorescent Emission from Organic Electroluminescent Devices", Nature 395:151-154, 1998.

Baldo et al., "Very high efficiency green organic light—emitting devices based on electrophosphorescence," Appl. Phys.Lett. 75(3):4-6, 1999.

Chen and Tang, 1997, "Recent Developments in Molecular Organic Electroluminescent Materials", Macromol. Symp. 125: 1-48.

Hung and Chen, "Recent progress of molecular organic eletroluminescent materials and devices", Mat. Sci and Eng. R, 39:143-222. , 2002.

PCT International Search Report and Written Opinion from PCT/US2007/020304, mailed on Mar. 13, 2008.

Sun et al., 2006, "Management of singlet and triplet excitons for efficient white organic light-emitting devices", Nature 440:908-912.

Goushi et al., 2004, "Triplet exciton confinement and unconfinement by adjacent hole-transport layers", J. Of Appl. Phys. 95:7798-7802.

Office Action from Japanese Patent Application No. 2009 534 572, mailed on Jul. 31, 2012.

\* cited by examiner (A)

(B)

US 8,945,722 B2

MATERIALS AND ARCHITECTURES FOR EFFICIENT HARVESTING OF SINGLET AND TRIPLET EXCITONS FOR WHITE LIGHT EMITTING OLEDS

GOVERNMENT RIGHTS

This invention was made with Government support under Contract No. DE-FC26-04NT42272 awarded by the Department of Energy. The government has certain rights in this invention.

RESEARCH AGREEMENTS

The claimed inventions were made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed inventions were made, and the claimed inventions were made as a result of activities undertaken within the scope of the agreement.

FIELD OF THE INVENTION

The present invention relates to organic light emitting devices (OLEDs), and more specifically to OLEDS that emit light using a combination of fluorescent emitters and phosphorescent emitters for the efficient utilization of all of the electrically generated excitons. In preferred embodiments, the invention relates to white-emitting OLEDS (WOLEDs). The devices of the invention utilize materials and architecture which allow for recombination to occur at a single region or interface within the OLED structure

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

The quality of white illumination sources can be described by a simple set of parameters. The color of the light source is given by its CIE chromaticity coordinates x and y (1931 2-degree standard observer CIE chromaticity). The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light.

When considering the use of these white light sources for illumination, the CIE color rendering index (CRI) may be considered in addition to the CIE coordinates of the source. The CRI gives an indication of how well the light source will render colors of objects it illuminates. A perfect match of a given source to the standard illuminant gives a CRI of 100. Though a CRI value of at least 70 may be acceptable for certain applications, a preferred white light source may have a CRI of about 80 or higher.

White OLEDs having only phosphorescent emissive materials may be highly efficient, but their operation stability is currently limited by the lifetime of the blue phosphorescent component. White OLEDs having all fluorescent emissive materials may have good operational stability, but their external quantum efficiency is generally about three times lower than that of all-phosphorescent white OLEDs. The present invention combines phosphorescent and fluorescent technologies in an improved device structure to achieve an improved balance of efficiency and lifetime in a white OLED.

SUMMARY OF THE INVENTION

The present invention provides organic light emitting devices having a combined emission from at least two emissive materials, a fluorescent emissive material and a phosphorescent emissive material, in order to directly utilize all of the electrically generated excitons. A fluorescent emissive material and a phosphorescent emissive material are present in separate emissive layers, with recombination occurring in the fluorescent layer or at an interface with the fluorescent layer. Localizing recombination may be achieved by doping the fluorescent and phosphorescent emissive layers of the devices of the present invention with a charge-transporting dopant.

The devices of the present invention utilize high efficiency fluorescent emitters for harvesting the singlet fraction of the generated excitons and high efficiency phosphorescent emitters for the triplet fraction of the generated excitons. Thus, the present invention is directed toward efficient utilization of all of the electrically generated excitons (potentially giving 100% internal efficiency).

The present invention also provides an organic light emitting device comprising a cathode, an emissive region, and an anode, wherein the emissive region comprises a fluorescent layer comprising a fluorescent emitting material as a dopant in a host material, and a phosphorescent layer comprising a phosphorescent emitting material as a dopant in a host material. The emissive region further comprises a charge-transporting dopant that is doped into the host material.

The present invention also provides an organic light emitting device comprising a cathode, an emissive region and an anode, wherein the emissive region comprises the following layers in sequence: a fluorescent layer comprising a fluorescent emitting material as a dopant in a host material, an optional spacer layer, and a phosphorescent layer comprising a phosphorescent emitting material as a dopant in a host material. The fluorescent layer, spacer layer and phosphorescent layer also comprise a charge-transporting dopant material.

DETAILED DESCRIPTION

Figure 1:
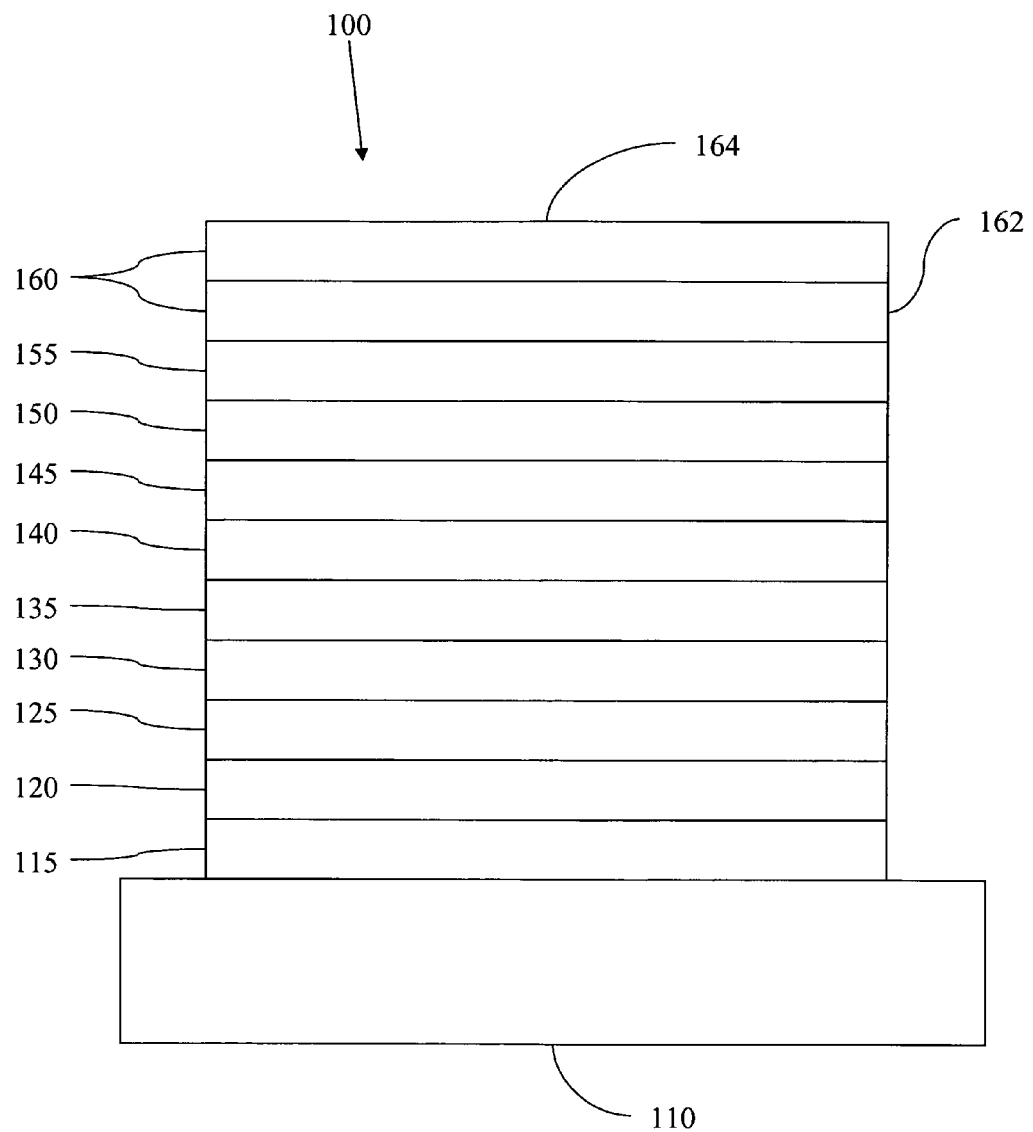
FIG. 1 shows an organic light emitting device having separate electron transport, hole transport, and emissive layers, as well as other layers.

Fluorescent organic light-emitting devices have an upper limit of approximately 25% for internal quantum efficiency (IQE), due to the requirement of spin-symmetry conservation. The alternative radiative process of phosphorescence has shown very high, even nearly 100% IQE. However, blue phosphorescent dopants with long lifetimes have not been achieved yet, which limits the device lifetime and thus the application potential of the three-color white OLED (WOLED) using red, green and blue phosphorescent dopants. Furthermore, in devices having only phosphorescent emitting materials, the exchange interaction energy is effectively lost, since phosphorescent materials emit light from spin-symmetric excitons (triplets) whose energy level is ~0.8 eV lower than spin-antisymmetric excitons (singlets) in organic system. In the present invention, these deficiencies are overcome by using a fluorescent dopant to harness higher-energy singlet excitons for blue emission and phosphorescent dopants to harness lower-energy triplet excitons for green and red emission. For the devices of the invention, the IQE can be as high as 100%.

Thus, the present invention is directed toward efficient utilization of all of the electrically generated excitons (potentially giving 100% internal efficiency). The approach described herein uses a combination of fluorescent and phosphorescent emitting materials in order to directly utilize all of the electrically generated excitons. A phosphorescent emitting material is used for the efficient harvesting and emission from triplet excitons, while the singlet excitons formed by hole-electron recombination are trapped at a fluorescent emitting material directly and not transferred to the phosphorescent emitting material. Thus, the devices of the invention will emit from singlet and triplet emissive centers, the fluorescent emitting material and the phosphorescent emitting material, respectively.

A key advantage of the present invention over the previous applications of electrophosphorescence is that separate colors can be emitted from the fluorescent and phosphorescent centers in a simplified device structure. For example, in a device according to an embodiment of the present invention may be constructed to have blue emission from a fluorescent dopant and green emission from the phosphorescent dopant. The result would be an OLED with an emission spectrum that was the sum of the blue and green emission spectra. Alternatively, a device according to another embodiment of the present invention may be used to prepare a white emissive OLED, in which the high-energy component of the spectrum (i.e., blue) is from the fluorescent dopant and the green-to-red (G-R) components of the white light are provided by the phosphorescent dopant(s). The G-R phosphor could be a single dopant that emits with a broad emission spectrum or two dopants, chosen such that the sum of their spectra covers the range from green to red. In this way, 25% of the excitons would produce blue light, while the remaining 75% are used for the G-R part of the emission spectrum. This is roughly the ratio of blue to G-R in the typical white OLED spectrum. This approach to a white OLED may have the benefit of a stable color balance as the drive voltage is increased and an enhanced stability. The enhanced stability results from having long lived fluorescent blue components coupled to long lived G-R phosphors in a single device.

Alternatively, a device according to an embodiment of the present invention may be constructed using a blue-emitting fluorescent dopant to harness higher-energy singlet excitons for blue emission and a green phosphorescent emitter co-doped with a red fluorescent emitter to harness lower-energy triplet excitons. The emission from the red fluorescent emitter is sensitized by the presence of a co-doped phosphor in a common conductive host. By lightly doping the sensitized layer with the fluorophore, less than complete transfer of triplets from the green phosphor results in a mixture of red and green emission. Combined with the emission from the singlet-harvesting blue fluorophore, the desired color balance may be achieved.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 milliseconds, and typically greater than 100 milliseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-Bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer (HTL) 125, an electron blocking layer 130, an emissive layer 135, a hole blocking layer 140, an electron transport layer (ETL) 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-02309890 to Forrest et al., which is incorporated by reference in its entirety. Other hole transport layers may be used.

The emissive region 135 is comprised of at least two emissive layers, each of which includes an organic material capable of emitting light when a current is passed between anode 115 and cathode 160. At least one of the emissive materials should be a phosphorescent emissive material, and at least on of the emissive materials should be a fluorescent emissive material. The emissive layers may also comprise a host material capable of transporting electrons and/or holes, doped with an emissive material that may trap electrons, holes, and/or excitons, such that excitons relax from the emissive material via a photoemissive mechanism. An emissive layer may comprise a single material that combines transport and emissive properties. Whether the emissive material is a dopant or a major constituent, the emissive layer may comprise other materials, such as dopants that tune the emission of the emissive material. Emissive region 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive region 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:L, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
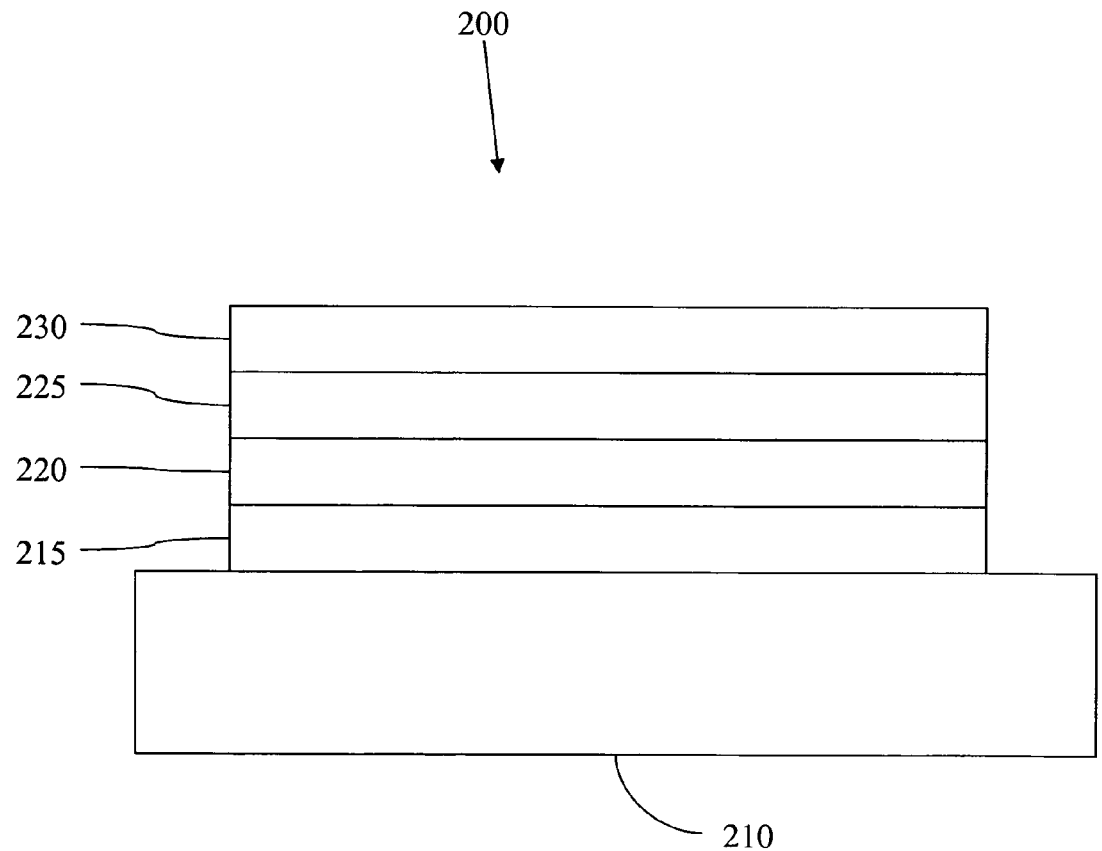
FIG. 2 shows an inverted organic light emitting device that does not have a separate electron transport layer.
Figure 3:
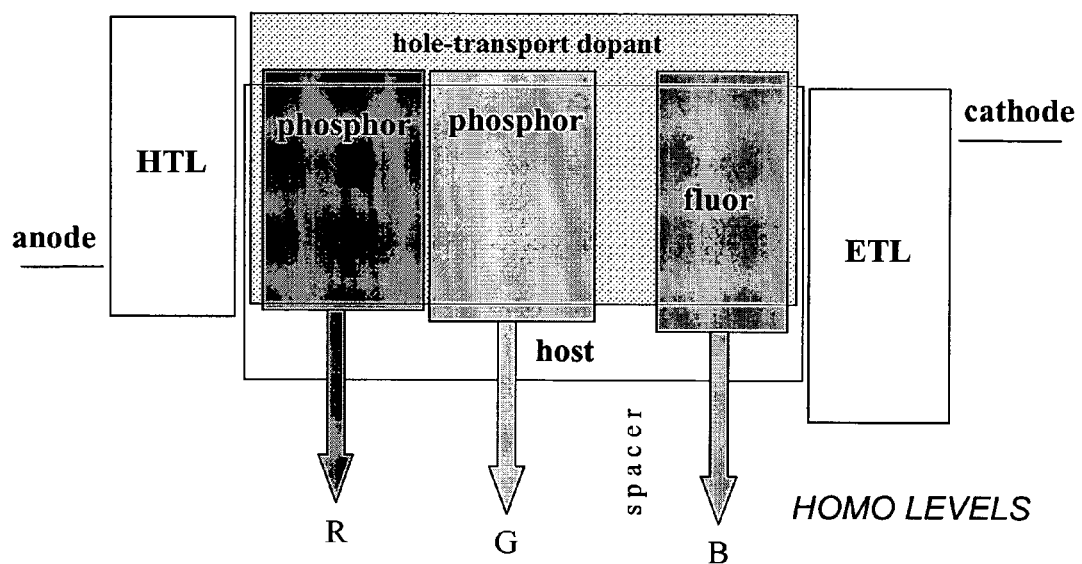
FIG. 3 show schematic device structures for embodiments of the invention having an anode, a hole transporting layer (HTL), an emissive region, an electron transporting layer (ETL) and a cathode. The emissive region comprises separate phosphorescent layers for red (R) and green (G) emission, a spacer layer, and a fluorescent layer for blue emission. The emissive region further comprises a hole-transporting dopant.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The devices of the present invention utilize high efficiency fluorescent emitters for harvesting the singlet fraction of the generated excitons and high efficiency phosphorescent emitters for the triplet fraction of the generated excitons. For a white device, the devices of the invention may utilize a blue fluorescent material in combination with a green and red phosphorescent emitting material to yield high power efficiency, stable color balance and the potential for 100% internal quantum efficiency. Two distinct modes of energy transfer channel nearly all of the triplet energy to the phosphorescent emitting material(s), while retaining the singlet energy exclusively on the fluorescent emissive material. Additionally, eliminating the exchange energy loss from the singlet excitons allows for up to about 20% increased power efficiency compared to a phosphorescent-only device. This device architecture is distinctive in that the singlet and triplet excitons are harvested along independent channels, and thus the transfer from host to dopant for both species can be separately optimized to be nearly resonant, thereby minimizing energy losses while maintaining a unity IQE.

The invention provides efficient white-emitting or multi-colored emitting OLEDs. For white emitting devices, the combined emission of the emitting materials gives a white emission from the device. For preferred white-emitting devices, the two or more emissive dopants are selected so that the combined emission from the device has a CIE range between X=0.37±0.07 and Y=0.37±0.07. More preferably, the CIE coordinates are X=0.35±0.05, and Y=0.35±0.05 and even more preferably X=0.33±0.02, Y=0.33±0.02. The term "multicolored" refers to the emission from a device that results from two or more different emitting materials that each have different emissive spectra. Although a high CRI value may be preferred for certain lighting applications, the devices of the present invention may be used to produce a light source that provides other colors as well. In preferred embodiments, the devices of the present invention are capable of achieving an external quantum efficiency of at least about 6%.

For white-emitting devices for illumination, the color rendering index (CRI) may be an important consideration, as the CRI gives an indication of how well the light source will render the colors of objects it illuminates. For preferred white-emitting devices of the invention, the CRI value is at least about 75, more preferably at least about 80, and most preferably at least about 85.

Figure 6:
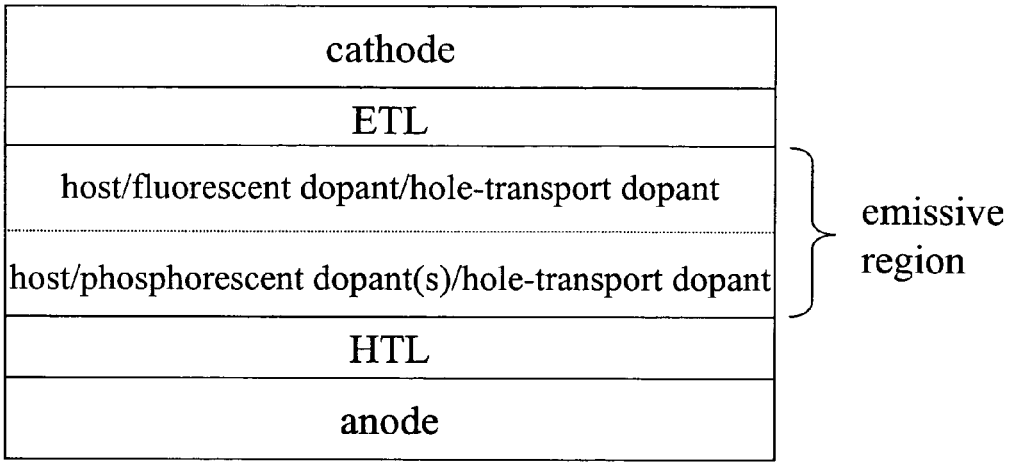
FIG. 6 show schematic device structures for embodiments of the invention.
Figure 6:
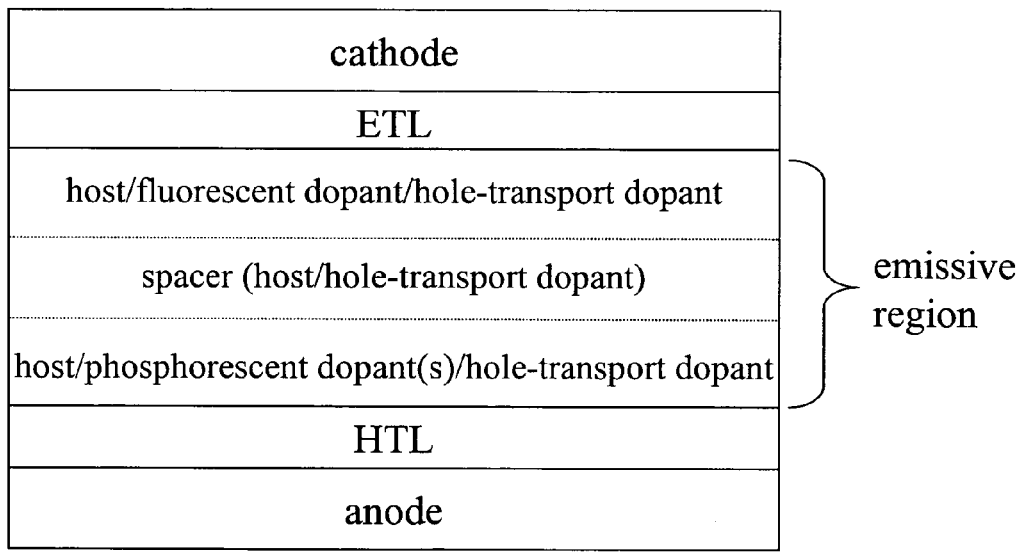
Figure 7:
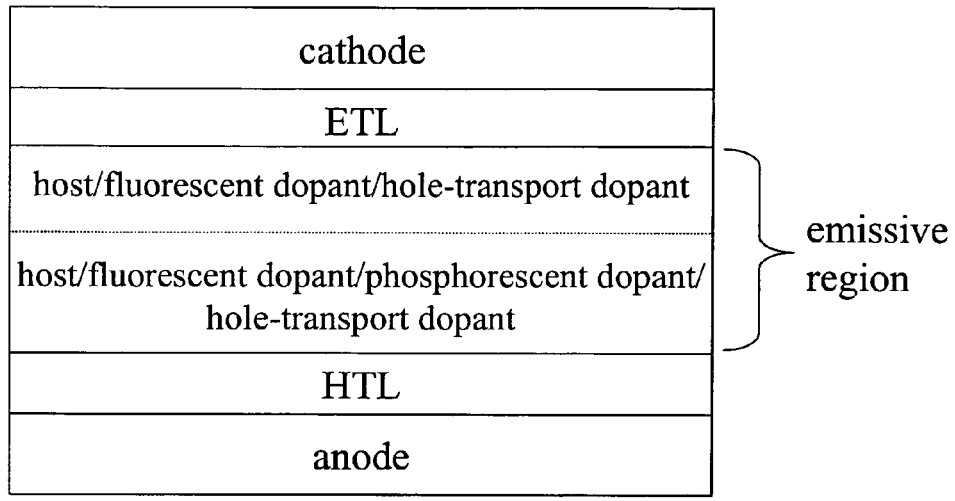
FIG. 7 show schematic device structures for embodiments of the invention.
Figure 7:
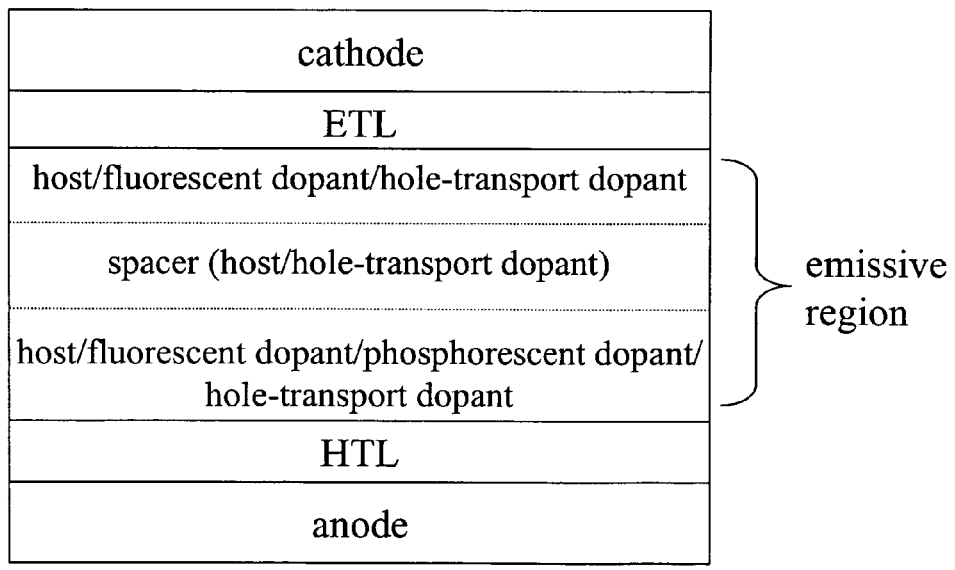

The emissive region is comprised of multiple layers such that fluorescent emitting material(s) and the phosphorescent emitting material(s) are doped into different layers within the emissive region. In preferred embodiments of the invention, the emissive region comprises two or more layers such that the fluorescent emitting material(s) and the phosphorescent emitting material(s) are doped into different layers within the emissive region. In one embodiment of the invention, the emissive region comprises two adjacent emissive layers, a fluorescent emissive layer and a phosphorescent emissive layer. A representative structure of a device according to this embodiment is depicted in FIG. 6A. The fluorescent layer comprises a material that emits via a fluorescent mechanism (i.e., by the decay of a singlet exciton). In preferred embodiments, the fluorescent layer further comprises a host material into which the fluorescent emitting material is doped. The phosphorescent layer comprises one or more phosphorescent emitting materials which are present as dopants in a host material. The phosphorescent materials may be present in the same layer or in separate layers within the emissive region.

When two phosphorescent emitting materials are used (for example, a green-emitting phosphorescent material and a red-emitting phosphorescent material) the two phosphorescent materials may be co-doped into the same layer. Alternatively, two phosphorescent materials may be doped into separate phosphorescent layers (for example, a separate green phosphorescent layer and red phosphorescent layer).

Figure 4:
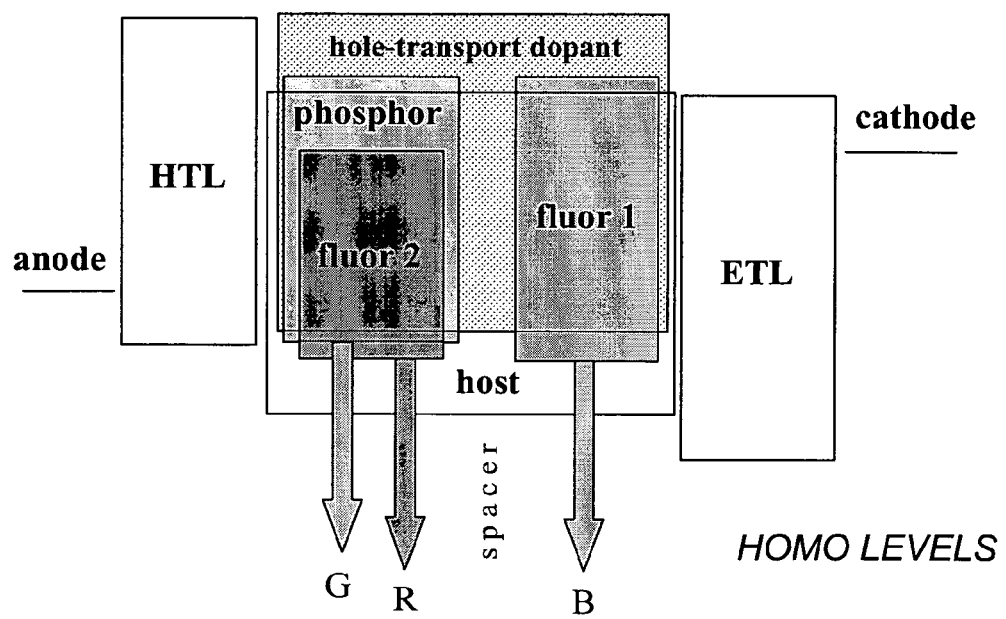
FIG. 4 show schematic device structures for embodiments of the invention having an anode, a hole transporting layer, an emissive region, an electron transporting layer and a cathode. The emissive region comprises a phosphorescent-sensitized fluorescent layer having a phosphorescent dopant for green (G) emission and a fluorescent dopant for red (R) emission, a spacer layer, and a fluorescent layer for blue emission. The emissive region further comprises a hole-transporting dopant.
Figure 5:
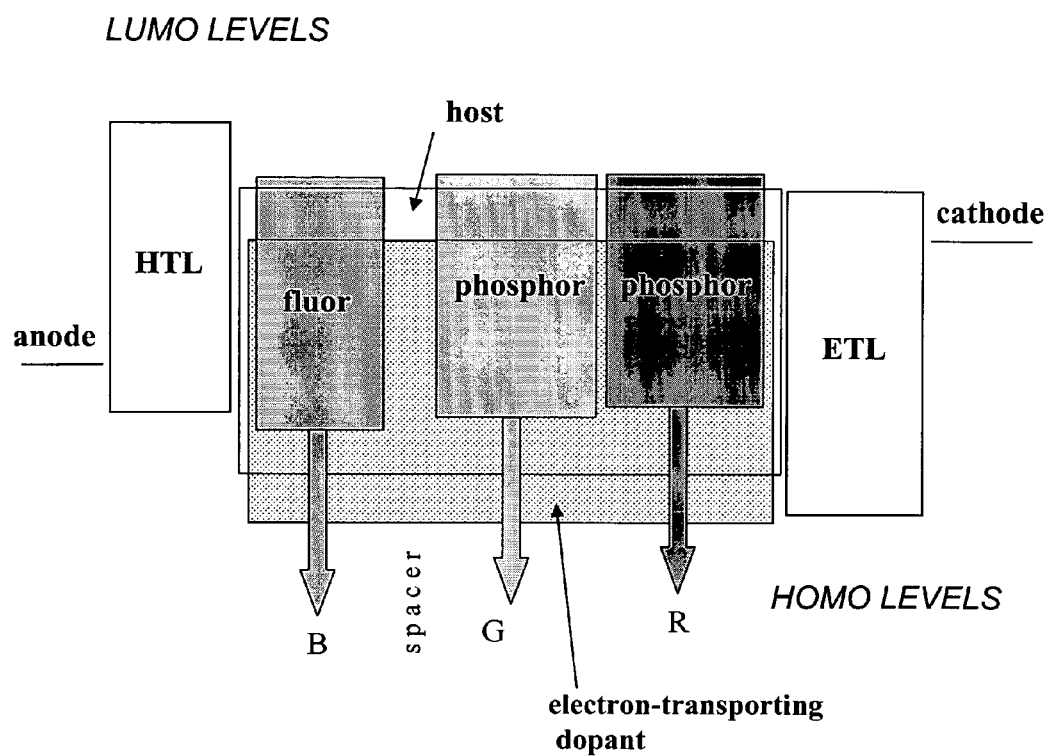
FIG. 5 show schematic device structures for embodiments of the invention having an anode, a hole transporting layer, an emissive region, an electron transporting layer and a cathode. The emissive region comprises separate phosphorescent layers for red (R) and green (G) emission, a spacer layer, and a fluorescent layer for blue emission. The emissive region further comprises an electron-transporting dopant.

In other embodiments of the invention the phosphorescent layer is co-doped with a fluorescent emitting material to yield a phosphorescent-sensitized fluorescent layer comprising a second fluorescent emitting material and a phosphorescent emitting material as dopants in a host material. In preferred embodiments, the first fluorescent emitting material is a blue-emitting material and the phosphorescent-sensitized fluorescent layer has a green-emitting phosphorescent material and a red-emitting fluorescent material (See FIG. 4). The emission from the second (red) fluorescent dopant is sensitized by the presence of a co-doped phosphorescent material in the common host of the phosphor-sensitized emissive layer. By lightly doping the sensitized layer with the second fluorescent emissive material, less than complete transfer of triplets from the phosphorescent material results in a combined emission from the two emissive materials of the phosphorescent-sensitized layer. In preferred embodiments the combined emission is a mixture of red and green emission from the fluorescent emitter and the phosphorescent emitter, respectively. Combined with the emission from the singlet-harvesting blue fluorophor, the desired white color balance is achieved. With this method, a wide variety of fluorescent dyes can be used for WOLEDs while maintaining the high luminance and quantum efficiencies.

In preferred embodiments of the invention, the fluorescent (only) layer is separated from the phosphorescent layer(s) or the phosphorescent-sensitized layer by a spacer layer. Representative structures of devices according to this embodiment are depicted in FIGS. 3, 4, 5, 6B and 7B. Direct energy transfer across the fluorescent/phosphorescent doped interface can act to inhibit all excitons from emitting from the lower energy phosphors than in the fluorescent layer. A spacer may help to inhibit direct exciton migration, or even a higher energy host will provide an energy barrier to help with this inhibition but will not be so thick as to eliminate Dexter (tunneling) transfer. The spacer layer serves as a buffer, preventing direct transfer of singlets to the adjacent phosphorescent layer. Since singlet lifetime is very short, putting a spacer between fluorescent-doped layer and phosphorescent-doped layers can insure the majority of singlets are localized on fluorescent dopant molecules without easily transferring onto the phosphorescent dopant singlet states followed by effectively inter-system crossing to their triplets. The spacer layer is preferably thick enough to prevent singlet transfer via Förster mechanisms, i.e., the spacer has a thickness larger than the Förster radius (~30 Å). The spacer layer is preferably thin enough to allow the triplet excitons to reach the phosphorescent layer. In preferred embodiments the spacer layer is between about 30 Å to 200 Å and in particularly preferred embodiments the spacer layer is between about 40 Å to 150 Å thick. The spacer layer is preferably comprised of the same material as the host for the fluorescent and/or phosphorescent layer.

In preferred embodiments of the invention the host material for the fluorescent layer and phosphorescent layer are the same material. In the embodiments of the invention having a spacer layer separating the fluorescent layer and phosphorescent layer, the spacer layer is also preferably composed of the host material. This allows for optimal performance and the elimination of energy barriers to transport.

In preferred embodiments of the invention, the emissive region of the device is composed of layers such that the emissive region has the following structure:
fluorescent layer/phosphorescent layer;
fluorescent layer/spacer/phosphorescent layer;
fluorescent layer/spacer/phosphorescent layer/phosphorescent layer;
fluorescent layer/phosphorescent-sensitized layer; and
fluorescent layer/spacer/phosphorescent-sensitized layer.

For each configuration of the emissive region, it is preferred that layers directly adjacent to the emissive region block excitons and the opposite charge that they conduct.

The devices of the invention are constructed so that recombination occurs primarily in the fluorescent layer. Even more preferably, the device is constructed so that the recombination zone is at the interface of a fluorescent layer and an adjacent transport layer (HTL or ETL) or blocking layer. This may be achieved by doping a charge-transporting dopant into the layers of the emissive region. Thus, in preferred embodiments, the fluorescent layer, phosphorescent layer(s) and spacer layer are each doped with the charge transporting-dopant.

The use of a charge transporting dopant in the emissive layers allows for recombination to occur substantially at a single region or interface within the OLED. Preferably, recombination occurs primarily in the fluorescent layer, or at the interface between the fluorescent layer and an adjacent layer (for example, an adjacent electron-transport layer, hole-transport layer, or blocking layer).

The charge-transporting dopant material may be selected from any material which facilitates the transport of holes or electrons across the emissive region when doped into the host material(s) or the emissive region, and which does not substantially interfere with emission from emissive layers. Preferably the charge-transporting material can be co-doped into the emissive region by standard techniques, most preferably vacuum deposition. The charge-transporting dopant is preferably doped into a host material at a concentration of about 10% to about 50%.

In one embodiment of the invention, the charge-transporting dopant is a hole transporting dopant. The hole-transporting dopant facilitates the transport of holes from the HTL across the emissive region so that recombination occurs substantially at, or near, the interface of the emissive region and the ETL, or a blocking layer adjacent to the ETL. In this embodiment, the fluorescent layer of the emissive region should be adjacent to the ETL, or a blocking layer adjacent to the ETL, such that substantially all of the excitons are formed in the fluorescent layer. As discussed above, the singlet excitons are trapped on, and emit from, the fluorescent emitting material in the fluorescent layer, while the triplet excitons diffuse to the phosphorescent layer or layers. Preferably, the hole-transporting dopant is selected such that (i) its HOMO level is above those of both the fluorescent emitting material(s) and the phosphorescent emitting material(s), and (ii) it has a triplet energy higher than that of the host material. In this way the hole-transporting dopant will trap and carry holes in all layers of the emissive region, and will not trap triplet or singlet excitons. These parameters may also prevent carrier trapping and recombination at the phosphorescent emitting material, which may alter the fluorescent/phosphorescent emission ratio as the voltage is changed, and thus may provide a device with improved chromaticity stability as a function of voltage. Preferably the hole-transporting dopant will have a HOMO level that is above the HOMO levels of the emissive materials by at least 0.1 eV, more preferably at least 0.2 eV, and even more preferably at least 0.3 eV.

The hole-transporting dopant material may be selected from any material which facilitates the transport of holes across the emissive region when doped into the host material(s), and which does not substantially interfere with emission from emissive layers. Preferred hole transporting materials include poly aryl amines, naphthyl analogs of aminobenzenes, fused polycyclic aromatics, oligoarenes, oligofluorenes, and metal complexes. The hole-transporting dopant may be selected from HTL materials known in the art (for example, NPD, TPD, HMTPD, TCTA etc., and derivatives thereof). However, because the hole-transporting dopant does not need to be capable of forming stable amorphous films, the range of materials that may be employed as the hole-transporting dopant is not limited to HTL materials. Preferred poly aryl amines for use as the hole-transporting dopant include para-bis(N,N-diphenylamino)benzene.

In another embodiment of the invention, the charge-transporting dopant is an electron-transporting dopant. The electron-transporting dopant facilitates the transport of electrons from the ETL across the emissive region so that recombination occurs substantially at, or near, the interface of the emissive region and the HTL, or a blocking layer adjacent to the ETL. In this embodiment, the fluorescent layer of the emissive region should be adjacent to the HTL, or a blocking layer adjacent to the ETL, such that substantially all of the excitons are formed in the fluorescent layer. As discussed above, the singlet excitons are trapped on, and emit from, the fluorescent emitting material in the fluorescent layer, while the triplet excitons diffuse to the phosphorescent layer or layers. Preferably, the electron-transporting dopant is selected such that (i) its LUMO level is below those of both the fluorescent emitting material and the phosphorescent emitting material(s), and (ii) it has a triplet energy higher than that of the host material. In this way the electron-transporting dopant will trap and carry electrons in all layers of the emissive region, and will not trap triplet or singlet excitons. These parameters may also prevent carrier trapping and recombination at the phosphorescent emitting material, which can alter the fluorescent/phosphorescent emission ratio as the voltage is changed, and thus may provide a device with improved chromaticity stability as a function of voltage. Preferably the electron-transporting dopant will have a LUMO level that is below the LUMO levels of the emissive materials by at least 0.1 eV, more preferably at least 0.2 eV, and even more preferably at least 0.3 eV.

The electron-transporting dopant material may be selected from any material which facilitates the transport of electrons across the emissive region when doped into the host material(s), and which does not substantially interfere with emission from emissive layers. Preferred electron-transporting materials include phenanthrolines, aryl substituted oxazoles and triazoles, oligofluorenes, oligoarenes, and metal complexes. The electron-transporting dopant may be selected from ETL materials known in the art (for example, $Alq_3$, TAZ, OXD-7, etc., and derivatives thereof). However, because the electron-transporting dopant does not need to be capable of forming stable amorphous films, the range of materials that may be employed as the electron-transporting dopant is not limited to ETL materials.

In another embodiment of the invention the host material for the layers of the emissive region is a hole-transporting host material. In this embodiment, the fluorescent layer of the emissive region should be adjacent to the ETL, or a blocking layer adjacent to the ETL, such that substantially all of the excitons are formed in the fluorescent layer. As discussed above, the singlet excitons are trapped on, and emit from, the fluorescent emitting material in the fluorescent layer, while the triplet excitons diffuse to the phosphorescent layer or layers. Preferably, the hole-transporting host is selected such that (i) its HOMO level is above those of both the fluorescent emitting material(s) and the phosphorescent emitting material(s). In this way the hole-transporting host will trap and carry holes in all layers of the emissive region. These parameters may also prevent carrier trapping and recombination at the phosphorescent emitting material, which may alter the fluorescent/phosphorescent emission ratio as the voltage is changed, and thus may provide a device with improved chromaticity stability as a function of voltage. Preferably the hole-transporting host will have a HOMO level that is above the HOMO levels of the emissive materials by at least 0.1 eV, more preferably at least 0.2 eV, and even more preferably at least 0.3 eV. Hole transporting host materials may be selected from HTL materials known in the art that form stable films.

In the fluorescent (only) layer, the singlet excitons that are generated by the recombination of a hole and an electron are trapped by and emit from the fluorescent emissive material. The thickness of a fluorescent layer and the concentration of a fluorescent emitting material in the layer are adjusted so that the singlet excitons are completely trapped at the fluorescent emitting material. The triplet of the fluorescent dopant should be of sufficiently high energy that the triplet excitons are not trapped at the fluorescent dopant. Thus, in a preferred embodiment of the invention greater than about 75% of the recombination occurs within the fluorescent layer, and in particularly preferred embodiments, greater than 90% of the recombination occurs within the fluorescent layer.

The triplet excitons that are generated upon recombination diffuse from the recombination zone in the fluorescent layer into the phosphorescent emissive layer or the phosphorescent-sensitized layer. The triplet excitons will diffuse into the phosphor doped regions and be trapped. With the appropriate choice of materials, each dopant will emit with high efficiency and a high overall efficiency will be achieved for the device.

In a preferred embodiment of the invention, the fluorescent emissive material of the fluorescent layer is a blue-emitting fluorescent material. To date, phosphorescent blue emitters have generally displayed poor operational stability in OLEDs. Fluorescent blue emitters are selected to be highly efficient and to have good operational lifetimes in OLEDs.

Preferred fluorescent blue emitters include polyaromatic compounds such as 9,10-di(2-naphthylantracene), perylenes, phenylenes, and fluorenes, with 4,4'-(bis(9-ethyl-3-carbazovinylene)-1,1'-biphenyl being a particularly preferred fluorescent blue emitter. Preferred fluorescent blue emitters may be found in C. H. Chen, J. Shi, and C. W. Tang, "Recent Developments in Molecular Organic Electroluminescent Materials," Macromol. Symp. 125, pp. 1-48 (1997) and the references cited therein; L. S. Hung and C. H. Chen, "Recent progress of molecular organic electroluminescent materials and devices," Mat. Sci and Eng. R, 39 (2002), pp. 143-222 and the references cited therein, each of which is incorporated herein by reference in their entirety. Other preferred fluorescent blue emitters include arylpyrenes as described in the co-pending application entitled "Arylpyrene Compounds," Ser. No. 11/097,352, filed Apr. 4, 2005, which is incorporated herein by reference in its entirety. Other preferred blue fluorescent emitters include arylenevinylene compounds as described in U.S. Pat. Nos. 5,121,029 and 5,130,603, which are incorporated herein by reference in their entirety. The fluorescent blue emitting material is preferably doped into a host material at a concentration of about 1% to about 5%. The fluorescent layer preferably has a thickness of between about 50 Å to about 200 Å.

Preferred phosphorescent green emitters may be found in Baldo, M. A., Thompson, M. E. & Forrest, S. R. High efficiency fluorescent organic light-emitting devices using a phosphorescent sensitizer, Nature 403, 750-753 (2000); and in U.S. Pat. No. 6,830,828, each of which is incorporated herein by reference in their entirety. Preferred phosphorescent red emitters are derivatives of 2-phenylpyridine-iridium complexes, such as PQIr. Preferred phosphorescent red emitters may be found in U.S. Pat. Nos. 6,835,469 and 6,830,828, each of which is incorporated herein by reference in their entirety. The phosphorescent green emitting material is preferably doped into a host material at a concentration of about 2% to about 20%. The phosphorescent red emitting material is preferably doped into a host material at a concentration of about 2% to about 10%.

In an alternative embodiment of the invention, the green and red emission for the white device is provided by a single phosphorescent material that emits with a broad emission spectrum. Preferred dopants of this type include square planar organometallic platinum compounds, and may be found in U.S. Pat. Nos. 6,869,695 and 6,863,997, each of which is incorporated herein by reference in their entirety. The phosphorescent R-G emitting material is preferably doped into a host material at a concentration of about 5% to about 20%.

Fluorescent red emitting materials may be found in U.S. Pat. Nos. 5,989,737, 4,769,292, 5,908,581, and 5,935,720, each of which is incorporated herein by reference in their entirety. Preferred red fluorescent materials include the DCM/DCJ class of red emitters (such as 4-(dicyanomethylene)-2methyl-6-(p-dimethylaminostyryl)-4H-pyran and julolidyl derivatives), and quinacridones. In the phosphor-sensitized emissive layer, the presence of the co-doped phosphorescent emitting material sensitizes the fluorescent emitting material for emission. Thus, this fluorescent emitting material may be present in very low concentrations. Generally, red emitting dopants act as carrier trapping sites, and consequently the operating voltage is increased due to the reduced carrier mobility. In the phosphor-sensitized WOLED, the red dopant is only lightly doped, thereby preventing significant carrier trapping on the fluorophore. Moreover, the power efficiency is increased over that expected for an all-phosphor doped emissive region by eliminating exchange energy losses incurred by the very high energy required to excite the blue phosphor from the singlet and triplet states of the fluorescent host. In preferred embodiments the fluorescent emitting material of the phosphor-sensitized layer is present at a concentration of less than about 1%, preferably less than about 0.5%, and more preferably less than about 0.1%.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting. One of skill in the art would understand how to adjust other parameters, such as drive voltage, while maintaining a desired current density.

MATERIAL DEFINITIONS

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: t&trafluoro-tetracyano-quinodimethane
p-MTDATA: p-doped m-MTDATA (doped with $F_4$-TCNQ)
$Ir(ppY)_3$: tris(2-phenylpyridine)-iridium (also Irppy)
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: 4,4'-bis[N-(1-naphthyl)-N-phenyl-amino]-biphenyl
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
BCzVBi 4,4'-(Bis(9-ethyl-3-carbazovinylene)-1,1'-biphenyl
PQIr iridium(III) bis(2-phenyl quinolyl-N,C2') acetylacetonate
UGH2 p-bis(triphenylsilyly)benzene
DCJTB 4-(dicyanomethylene)-2-t-butyl-6-(1,1,7,7-tetramethyljulolidyl-9-enyl)-4H-pyran)
BCzVBi 4,4'-bis(9-ethyl-3-carbazovinylene)-1,1'-biphenyl

EXPERIMENTAL

Organic layers may be deposited under $10^{-6}$ Torr vacuum chamber by thermal evaporation. The anode electrode may be ~1200 Å of indium tin oxide (ITO). A 1 mm diameter shadow mask may be used to define LiF/Al cathode size. The cathode may consist of 10 Å of LiF followed by 1,000 Å of Al. Devices may be encapsulated with a glass lid sealed with an epoxy resin in a nitrogen glove box (<1 ppm of $H_2O$ and $O_2$) immediately after fabrication, and a moisture getter may be incorporated inside the package. The devices are generally tested under ambient conditions, in the dark, using a Hewlett-Packard 4156C semiconductor parameter analyzer and a Newport Model 2932-C dual-channel power meter.

What is claimed is:
1. An organic light emitting device comprising:
a cathode,
an emissive region, and
an anode
wherein,
the emissive region consists of:
a fluorescent layer comprising a fluorescent emitting dopant, and a charge-transporting dopant in a host material,
one or more phosphorescent layers, each comprising a phosphorescent emitting dopant, and a charge-transporting dopant in a host material, and
an optional spacer layer between the fluorescent layer and a phosphorescent layer comprising a charge-transporting dopant in a host material,
wherein the host material for the fluorescent layer, the host material for the phosphorescent layers and the host material for the spacer layer, if present, are the same material; and
wherein the charge-transporting dopant is a hole-transporting dopant or the charge-transporting dopant is an electron-transporting dopant, wherein if the charge-transporting dopant is a hole-transporting dopant, the HOMO level of the hole-transporting dopant is above and closer to the vacuum energy level than the HOMO level of the fluorescent emitting dopant and the HOMO level of the phosphorescent emitting dopant or if the charge-transporting dopant is an electron-transporting dopant, the LUMO level of the electron-transporting dopant is below the LUMO level of the fluorescent emitting dopant and the LUMO level of the phosphorescent emitting dopant, and wherein the triplet energy of the charge-transporting dopant is higher than the triplet energy of the host material.

2. The organic light emitting device of claim 1, wherein the charge-transporting dopant is a hole-transporting dopant.

3. The organic light emitting device of claim 1, wherein the charge-transporting dopant is the electron-transporting dopant.

4. The organic light emitting device of claim 1, wherein the emissive region consists of the fluorescent layer, the spacer layer and the one or more phosphorescent layers.

5. The organic light emitting device of claim 1, wherein the host material for the fluorescent layer, the host material for the phosphorescent layer and the spacer layer are comprised of CBP.

6. The device of claim 1, wherein the fluorescent emitting dopant is a blue emitting fluorescent material.

7. The organic light emitting device of claim 1, wherein greater than about 75% of the excitons are generated in the fluorescent layer.

8. The organic light emitting device of claim 2, wherein the hole transporting dopant for the fluorescent layer, the hole transporting dopant for the one or more phosphorescent layers and the hole transporting dopant for the optional spacer layer are comprised of the same material.

9. The device of claim 8, wherein the hole transporting dopant is

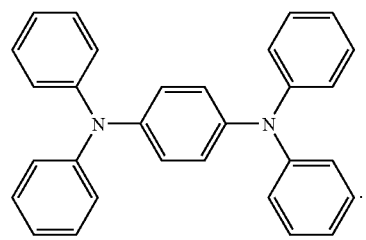 [SMILES: c1ccc(N(c2ccccc2)c2ccc(N(c3ccccc3)c3ccccc3)cc2)cc1]

10. An organic light emitting device comprising:
a cathode,
an emissive region, and
an anode
wherein the emissive region consists of:
a fluorescent layer comprising a first fluorescent emitting dopant and a hole-transporting dopant in a host material, a phosphorescent-sensitized fluorescent layer comprising a phosphorescent emitting dopant, a second fluorescent emitting dopant, and a hole-transporting dopant in a host material, and an optional spacer layer between the fluorescent layer and a phosphorescent layer comprising a charge-transporting dopant in a host material; and wherein the host material for the fluorescent layer, the host material for the phosphorescent-sensitized fluorescent layer and the host material for the space layer, if present, are the same material, wherein the HOMO level of the hole-transporting dopant is above and closer to the vacuum energy level than the HOMO level of the fluorescent emitting dopant and HOMO level of the phosphorescent emitting dopant, and wherein the triplet energy of the hole-transporting dopant is higher than the triplet energy of the host material.

11. The organic light emitting device of claim 10, wherein the emissive region consists of the fluorescent layer, the spacer layer and the phosphorescent-sensitized layer.

12. The organic light emitting device of claim 10, wherein the first fluorescent emitting dopant is a blue emitting fluorescent material.

13. The organic light emitting device of claim 12, wherein the phosphorescent emitting dopant is a green-emitting phosphorescent material and the second fluorescent emitting dopant is a red-emitting fluorescent dopant.

* * * * *